(12) United States Patent
Chen et al.

(10) Patent No.: US 8,053,752 B2
(45) Date of Patent: Nov. 8, 2011

(54) FOUR-TERMINAL RECONFIGURABLE DEVICES

(75) Inventors: Kuan-Neng Chen, White Plains, NY (US); Lia Krusin-Elbaum, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/987,089

(22) Filed: Jan. 8, 2011

(65) Prior Publication Data
US 2011/0102016 A1    May 5, 2011

Related U.S. Application Data

(63) Continuation of application No. 12/544,089, filed on Aug. 19, 2009, now Pat. No. 7,880,157.

(51) Int. Cl.
*H01L 29/04* (2006.01)
(52) U.S. Cl. .................................. 257/3; 257/2; 438/96
(58) Field of Classification Search .................. 257/2, 3; 438/95
See application file for complete search history.

(56) References Cited

U.S. PATENT DOCUMENTS

| | | | |
|---|---|---|---|
| 6,795,338 B2 | 9/2004 | Parkinson et al. | |
| 6,839,263 B2 | 1/2005 | Fricke et al. | |
| 6,967,344 B2 * | 11/2005 | Ovshinsky et al. | 257/2 |
| 7,057,923 B2 | 6/2006 | Furkay et al. | |
| 7,214,957 B2 | 5/2007 | Ryco et al. | |
| 7,214,958 B2 | 5/2007 | Happ | |
| 7,547,906 B2 * | 6/2009 | Ovshinsky | 257/3 |
| 7,579,616 B2 | 8/2009 | Chen et al. | |
| 7,608,851 B2 | 10/2009 | Chen et al. | |
| 7,659,534 B2 | 2/2010 | Chen et al. | |
| 7,687,309 B2 | 3/2010 | Chen | |
| 7,772,582 B2 | 8/2010 | Chen et al. | |
| 2005/0058187 A1 | 3/2005 | Groen et al. | |
| 2006/0097240 A1 | 5/2006 | Lowry et al. | |
| 2006/0097343 A1 | 5/2006 | Parkinson | |
| 2007/0057341 A9 | 3/2007 | Pelizzer | |
| 2007/0096071 A1 | 5/2007 | Kordus et al. | |

(Continued)

OTHER PUBLICATIONS

K.N. Chen et al., Thermal Stress Evaluation of a PCRAM Material Ge2Sb2Te5, 21st IEEE Non-Volatile Semiconductor Memory Workshop, pp. 97-98 (2006).

*Primary Examiner* — David Vu
*Assistant Examiner* — Brandon Fox
(74) *Attorney, Agent, or Firm* — Vazken Alexanian; MIchael J. Chang, LLC

(57) ABSTRACT

Reconfigurable devices and methods for the fabrication thereof are provided. In one aspect, a reconfigurable device is provided. The reconfigurable device comprises a substrate; a first dielectric layer on the substrate; a conductive layer recessed into at least a portion of a side of the first dielectric layer opposite the substrate; at least one second dielectric layer over the side of the first dielectric layer opposite the substrate, so as to cover the conductive layer; a heater within the second dielectric layer; at least one programmable via extending through the second dielectric layer, extending through and surrounded by the heater and in contact with the conductive layer, the programmable via comprising at least one phase change material; a capping layer over the programmable via; a first conductive via and a second conductive via, each extending through the second dielectric layer and in contact with the heater; and a third conductive via extending through the second dielectric layer and in contact with the conductive layer.

7 Claims, 9 Drawing Sheets

U.S. PATENT DOCUMENTS

| | | |
|---|---|---|
| 2007/0099405 A1 | 5/2007 | Oliva et al. |
| 2008/0142775 A1 | 6/2008 | Chen et al. |
| 2008/0237564 A1* | 10/2008 | Yoon et al. ............. 257/3 |
| 2008/0251778 A1 | 10/2008 | Chen et al. |
| 2008/0277644 A1 | 11/2008 | Chen et al. |
| 2009/0003045 A1 | 1/2009 | Chen |
| 2009/0014885 A1 | 1/2009 | Chen et al. |
| 2009/0033358 A1 | 2/2009 | Chen et al. |
| 2009/0033360 A1 | 2/2009 | Chen et al. |
| 2009/0101882 A1 | 4/2009 | Chen et al. |
| 2009/0111263 A1 | 4/2009 | Chen et al. |
| 2009/0291546 A1 | 11/2009 | Chen et al. |
| 2009/0305460 A1 | 12/2009 | Chen et al. |
| 2010/0038621 A1 | 2/2010 | Chen et al. |
| 2010/0127732 A1 | 5/2010 | Chen |
| 2010/0133502 A1 | 6/2010 | Chen |

* cited by examiner

FOUR-TERMINAL RECONFIGURABLE DEVICES

CROSS-REFERENCE TO RELATED APPLICATIONS

This application is a continuation of U.S. application Ser. No. 12/544,089 filed on Aug. 19, 2009 which is a divisional of U.S. application Ser. No. 11/776,295 filed on Jul. 11, 2007, now U.S. Pat. No. 7,772,582, which is related to the commonly owned U.S. application Ser. No. 11/770,455, now U.S. Pat. No. 7,687,309. The contents of each of the foregoing are incorporated by reference herein.

FIELD OF THE INVENTION

The present invention relates to reconfigurable circuits, and more particularly, to reconfigurable devices having programmable vias and methods for fabrication thereof.

BACKGROUND OF THE INVENTION

Reconfigurable circuits have been widely used in the semiconductor industry for field programmable gate arrays (FPGAs) and for repair of a defective memory element. The FPGA consists of a set of simple, configurable logic blocks in an array with interspersed switches that can rearrange interconnections between the logic blocks.

Reconfigurable circuits are also expected to play a significant role in three-dimensional integration technology that is being currently developed. Three-dimensional integration fabricates multilayer structures that can form a single chip combination with different functionalities. In these multilayer (and multifunctional) systems, reconfigurable circuit connection is typically needed to provide controllable logic functionality, memory repair, data encryption, as well as other functions.

Phase change materials are an attractive option for use in reconfigurable circuits. Devices with phase change materials, for example, are described in U.S. Patent Application No. 2007/0099405, filed by Oliva et al., entitled "Methods For Fabricating Multi-Terminal Phase Change Devices" (hereinafter "Oliva") and in U.S. Patent Application No. 2007/0096071, filed by Kordus et al., entitled "Multi-Terminal Phase Change Devices." (hereinafter "Kordus"). Specifically, Oliva and Kordus both describe multi-terminal phase change devices, for example, having two terminals located on opposite sides of the device from one another that are linked to the phase change material. Two other terminals control a heater that heats the phase change material to change the conductivity of the phase change material between different states.

A notable challenge that exists with regard to reconfigurable devices, in general, is that a large number of complex processing steps are typically required to produce the devices, which means high production costs and low production output. Thus, there exists a need for reconfigurable device technology that is more cost-effective and easier to produce.

SUMMARY OF THE INVENTION

The present invention provides reconfigurable devices and methods for the fabrication thereof. In one aspect of the invention, a reconfigurable device is provided. The reconfigurable device comprises a substrate; a first dielectric layer on the substrate; a conductive layer recessed into at least a portion of a side of the first dielectric layer opposite the substrate; at least one second dielectric layer over the side of the first dielectric layer opposite the substrate, so as to cover the conductive layer; a heater within the second dielectric layer; at least one programmable via extending through the second dielectric layer, extending through and surrounded by the heater and in contact with the conductive layer, the programmable via comprising at least one phase change material; a capping layer over the programmable via; a first conductive via and a second conductive via, each extending through the second dielectric layer and in contact with the heater; and a third conductive via extending through the second dielectric layer and in contact with the conductive layer.

The reconfigurable device can further comprise a first device terminal and a second device terminal, wherein the first device terminal comprises an upper portion of, and is continuous with, the first conductive via, and wherein the second device terminal comprises an upper portion of, and is continuous with, the second conductive via; a third device terminal, wherein the third device terminal comprises an upper portion of, and is continuous with, the third conductive via; and a fourth device terminal, located between the first and second device terminals, in contact with the capping layer.

In another aspect of the invention, a method of fabricating a reconfigurable device is provided. The method comprises the following steps. A substrate is provided. A first dielectric layer is formed on the substrate. A conductive layer is formed recessed into at least a portion of a side of the first dielectric layer opposite the substrate. A second dielectric layer is deposited over the side of the first dielectric layer opposite the substrate, so as to cover the conductive layer. A heater is formed on a side of the second dielectric layer opposite the first dielectric layer. A third dielectric layer is deposited over the side of the second dielectric layer opposite the first dielectric layer so as to surround at least a portion of the heater. At least one programmable via is formed extending through the second and third dielectric layers, extending through and surrounded by the heater and in contact with the conductive layer, the programmable via comprising at least one phase change material. A capping layer is formed over the programmable via. A first conductive via and a second conductive via are formed each extending through the third dielectric layer and in contact with the heater. A third conductive via is formed extending through the second and third dielectric layers and in contact with the conductive layer.

In yet another aspect of the invention, a method of performing a logic function is provided. The method comprises the following steps. A reconfigurable device is provided. The reconfigurable device comprises a substrate; a first dielectric layer on the substrate; a conductive layer recessed into at least a portion of a side of the first dielectric layer opposite the substrate; at least one second dielectric layer over the side of the first dielectric layer opposite the substrate, so as to cover the conductive layer; a heater within the second dielectric layer; at least one programmable via extending through the second dielectric layer, extending through and surrounded by the heater and in contact with the conductive layer, the programmable via comprising at least one phase change material; a capping layer over the programmable via; a first conductive via and a second conductive via, each extending through the second dielectric layer and in contact with the heater; and a third conductive via extending through the second dielectric layer and in contact with the conductive layer. An OFF switching pulse is passed through the heater, when the programmable via is in a conductive state, the OFF switching pulse being configured to amorphize at least a portion of the phase change material in the programmable via to switch the programmable via to a resistive state and/or an ON switching pulse is passed through the heater, when the programmable via is in a resistive state, the ON switching pulse being configured to anneal at least a portion of the phase change material in the programmable via to switch the programmable via to a conductive state.

In still another aspect of the invention, an integrated logic circuit is provided. The integrated logic circuit comprises a plurality of logic blocks; and at least one reconfigurable device interconnecting two or more of the logic blocks. The reconfigurable device comprises a substrate; a first dielectric layer on the substrate; a conductive layer recessed into at least a portion of a side of the first dielectric layer opposite the substrate; at least one second dielectric layer over the side of the first dielectric layer opposite the substrate, so as to cover the conductive layer; a heater within the second dielectric layer; at least one programmable via extending through the second dielectric layer, extending through and surrounded by the heater and in contact with the conductive layer, the programmable via comprising at least one phase change material; a capping layer over the programmable via; a first conductive via and a second conductive via, each extending through the second dielectric layer and in contact with the heater; and a third conductive via extending through the second dielectric layer and in contact with the conductive layer.

A more complete understanding of the present invention, as well as further features and advantages of the present invention, will be obtained by reference to the following detailed description and drawings.

DETAILED DESCRIPTION OF PREFERRED EMBODIMENTS

Figure 1:
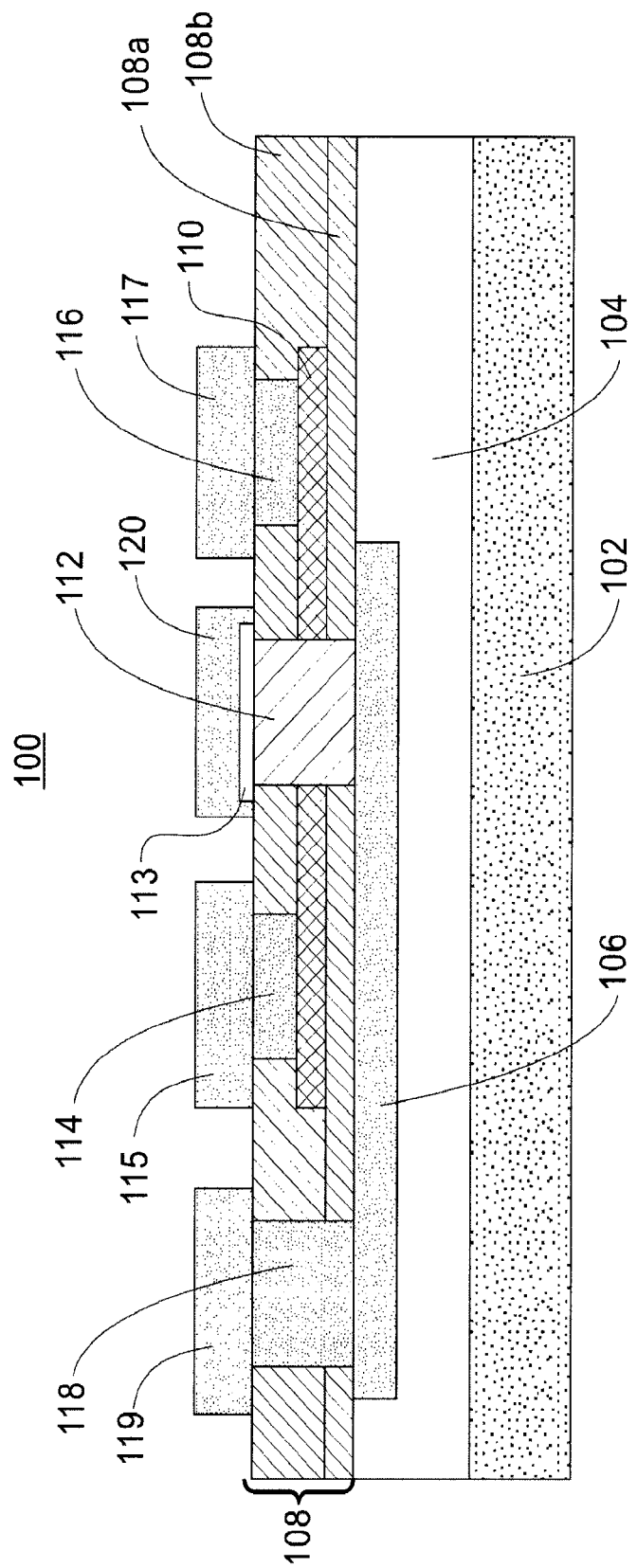
FIG. 1 is a diagram illustrating an exemplary reconfigurable device according to an embodiment of the present invention.
Figure 2A:
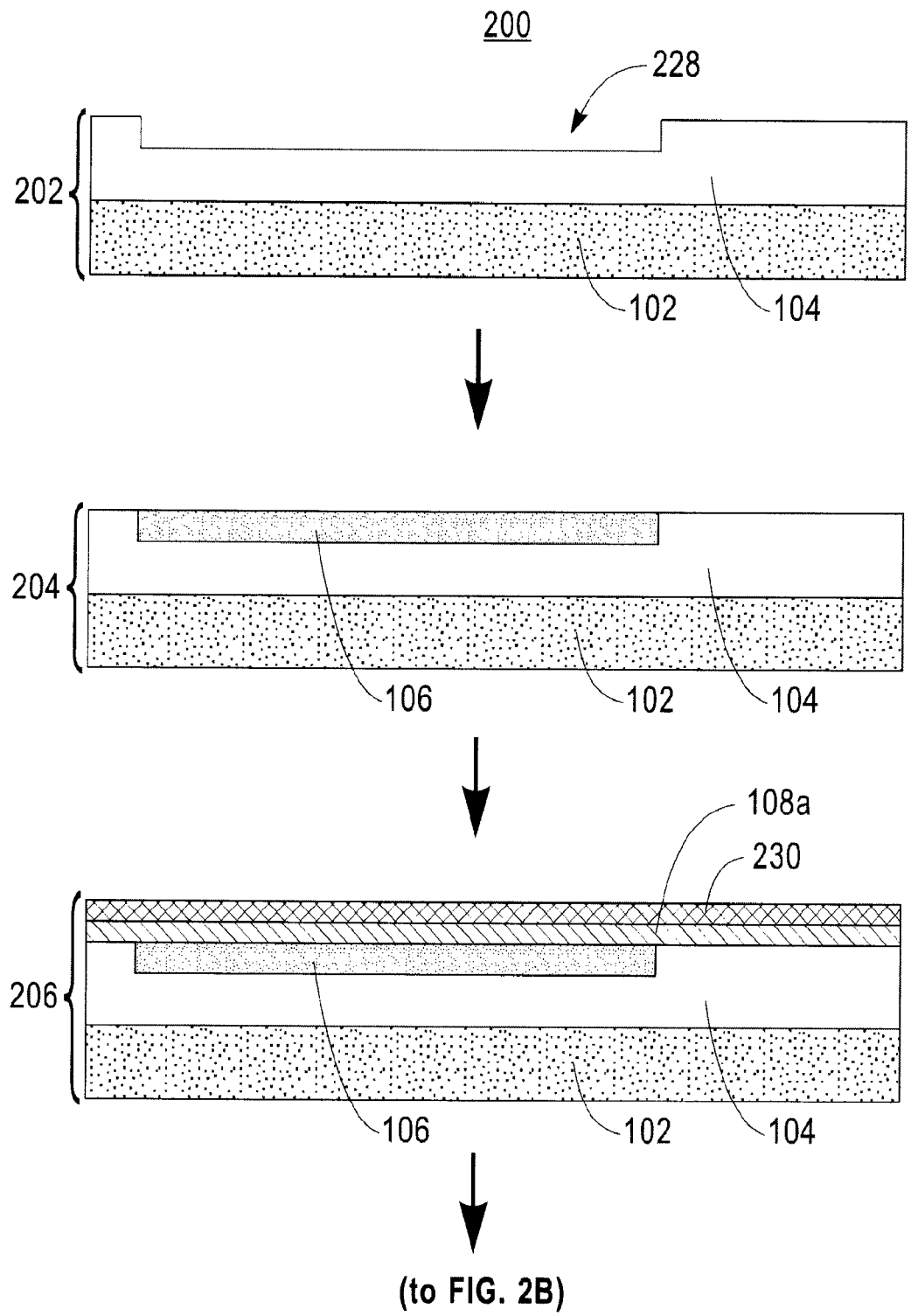
FIGS. 2A-D are diagrams illustrating an exemplary methodology for fabricating a reconfigurable device according to an embodiment of the present invention.
Figure 2B:
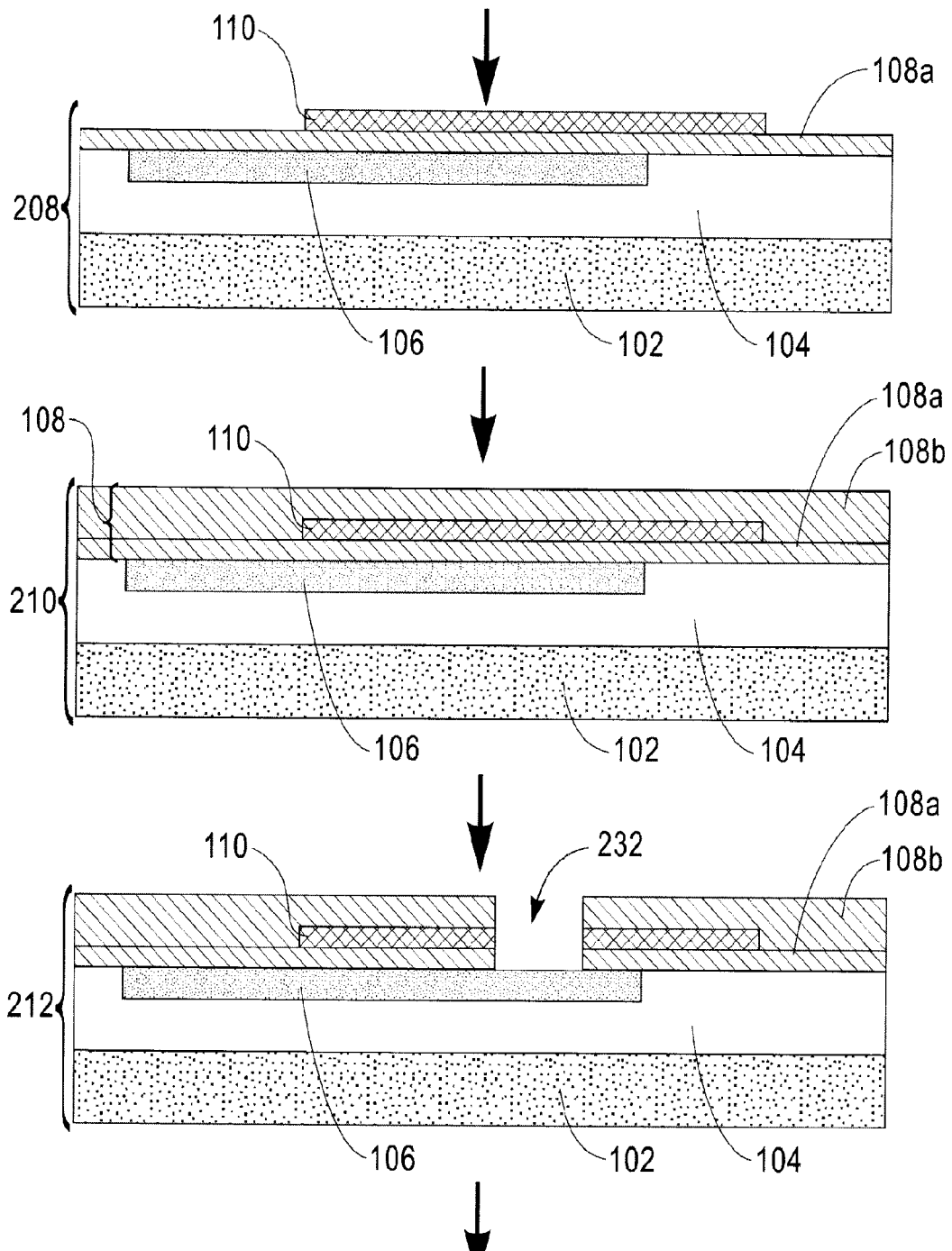
Figure 2C:
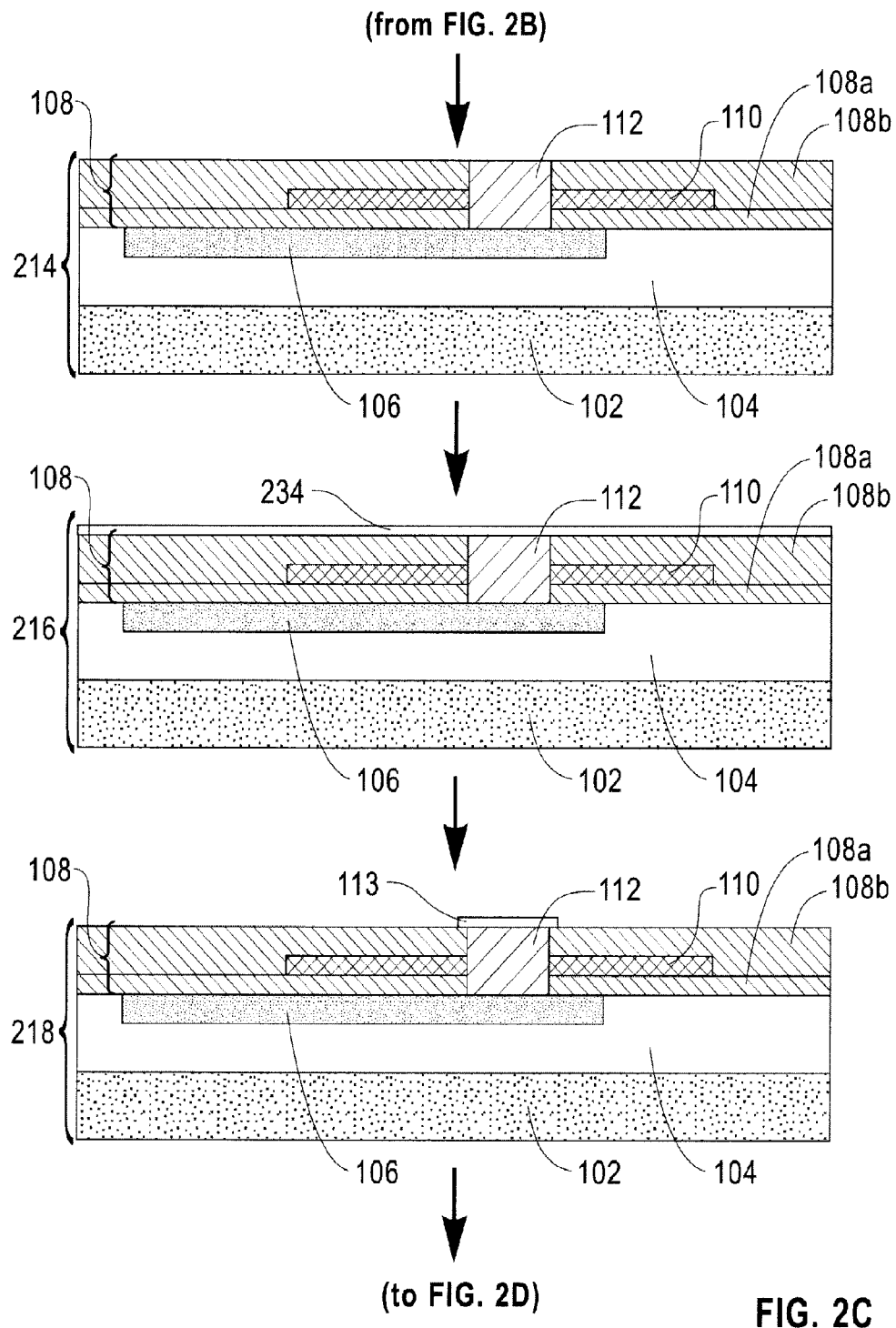
Figure 2D:
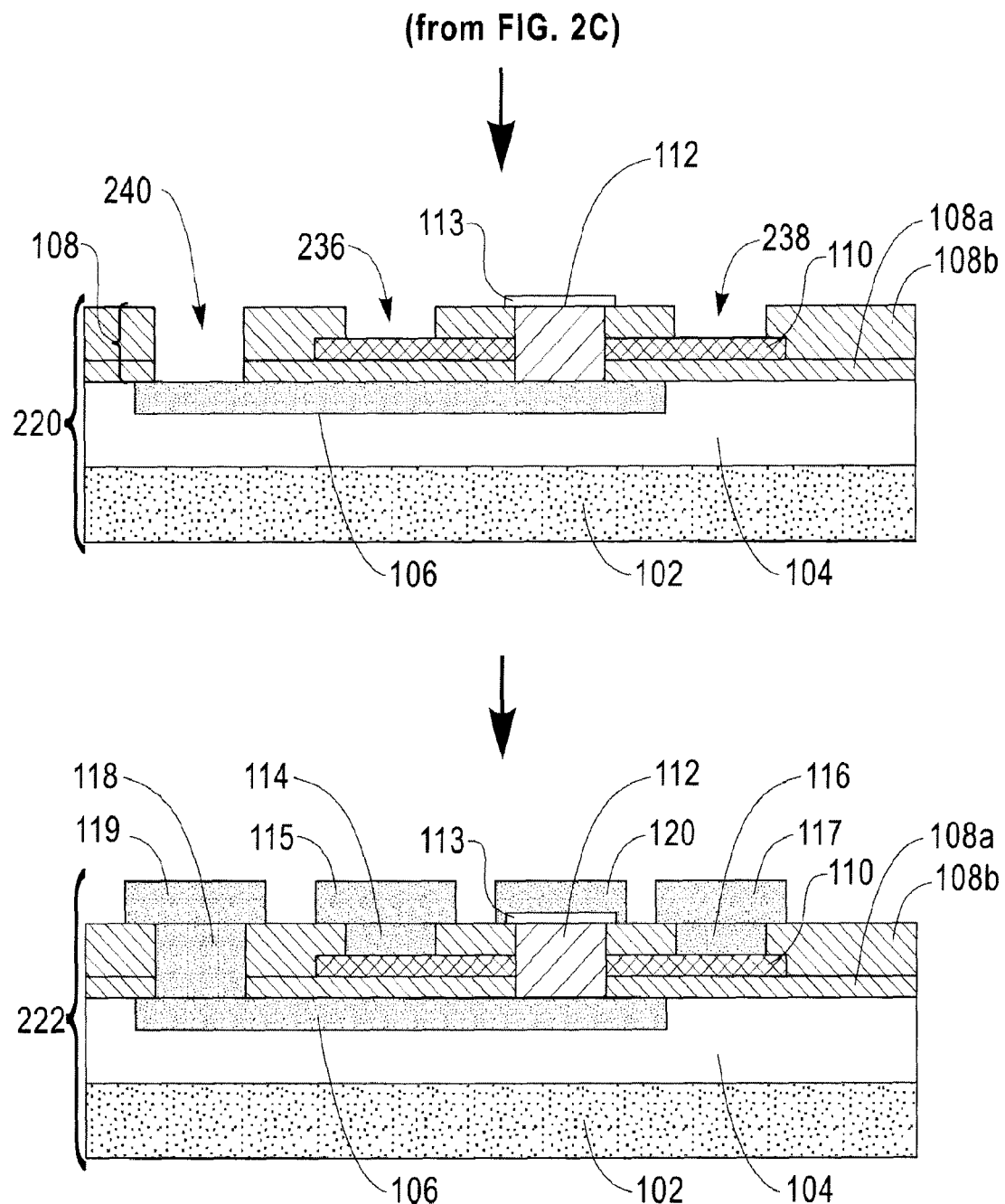

FIG. 1 is a diagram illustrating exemplary reconfigurable device 100. Reconfigurable device 100 comprises substrate 102, dielectric layer 104, conductive layer 106, dielectric layer 108, heater 110, programmable via 112, conductive vias 114, 116 and 118 and device terminals 115, 117, 119 and 120. Reconfigurable devices having programmable vias are sometimes referred to as programmable via devices. See, for example, U.S. application Ser. No. 11/770,455, entitled "CMOS-Process-Compatible Programmable Via Device," filed on Jun. 28, 2007, now U.S. Pat. No. 7,687,309, the contents of which are incorporated herein by reference.

Specifically, reconfigurable device 100 comprises dielectric layer 104 on substrate 102. Substrate 102 can comprise any suitable semiconductor material, including, but not limited to, silicon (Si). Dielectric layer 104, an insulating layer, can comprise any suitable dielectric material, including, but not limited to, oxides such as silicon dioxide ($SiO_2$).

Conductive layer 106 is recessed into a portion of a side of dielectric layer 104 opposite substrate 102. Conductive layer 106 can comprise any suitable standard complementary metal-oxide-semiconductor (CMOS) process metal(s), including, but not limited to, one or more of tungsten (W) and copper (Cu). As will be described in detail below, conductive layer 106 connects programmable via 112 with conductive via 118.

Dielectric layer 108 is present over the side of dielectric layer 104 opposite substrate 102 and covers conductive layer 106. Dielectric layer 108 can comprise any suitable dielectric material, including, but not limited to, silicon nitride ($Si_3N_4$), silicon oxynitride ($Si_2N_2O$) and oxides, such as $SiO_2$. According to an exemplary embodiment, dielectric layer 104 has a same composition as dielectric layer 108, e.g., $SiO_2$. Further, as will be described, for example, in conjunction with the description of FIG. 2, below, dielectric layer 108 can be formed as two separate layers in a two-step process. Accordingly, dielectric layer 108 can comprises dielectric layers 108a and 108b. Dielectric layer 108a can have a same composition as dielectric layer 108b, e.g., wherein both dielectric layer 108a and dielectric layer 108b comprise $SiO_2$, or alternatively, dielectric layer 108a can have a different composition from dielectric layer 108b, e.g., wherein dielectric layer 108a comprises $SiO_2$ while dielectric layer 108b comprises $Si_2N_2O$, or vice versa.

Heater 110 is present within dielectric layer 108. When dielectric layer 108 comprises two separate layers, i.e., dielectric layers 108a and 108b, as described above, heater 110 is present on a side of dielectric layer 108a opposite dielectric layer 104. Dielectric layer 108b is then present over the side of dielectric layer 108a opposite dielectric layer 104 and surrounds heater 110.

To achieve the best efficiency of electrical-thermal transformation (i.e., from heater to programmable via), according to an exemplary embodiment heater 110 comprises a thin layer of a refractory metal having a thickness of between about five nanometers (nm) and about 100 nm, with a relatively high resistivity of between about 100 ohm centimeter ($\Omega cm$) and about 10,000 $\Omega cm$, e.g., of between about 500 $\Omega cm$ and about 3,000 $\Omega cm$. Suitable refractory metals include, but are not limited to, tantalum nitride (TaN) and metals having the formula $Ta_xSi_yN_z$, wherein x, y and z are each between zero and about one.

Programmable via 112 extends through dielectric layer 108/heater 110 and makes contact with conductive layer 106. As highlighted above, conductive layer 106 connects programmable via 112 with conductive via 118. Programmable via 112 is thus continuous through heater 110, which is advantageous for a couple of notable reasons. First, the number of processing steps to form the programmable via is minimized. For example, an alternative arrangement may place a heater between two separate programmable vias. See, for example, U.S. application Ser. No. 11/733,523, entitled "Four-Terminal Programmable Via-Containing Structure and Method of Fabricating Same," filed on Apr. 10, 2007, now U.S. Pat. No. 7,579,616, the contents of which are incorporated herein by reference. This design, however, includes more processing steps, i.e., to fabricate separate programmable vias on either side of the heater. Further, as will be described in detail below, programmable via 112 can be switched between a conductive and a resistive state, i.e., by varying the resistivity of the phase change material in the programmable via. When using a programmable via that is continuous through the heater, the resistivity of the heater is not a consideration. By comparison, e.g., when a heater is present between two separate programmable vias, the resistance of the heater has to be factored in to the overall resistance of the programmable via. Thus, any variations in heater dimensions, such as in the heater thickness, can affect device performance.

Programmable via 112 comprises a phase change material. Suitable phase change materials include, but are not limited to, one or more of ternary alloys of germanium (Ge), antimony (Sb) and tellurium (Te) (GST), such as $Ge_2Sb_2Te_5$, GeSb, $GeSb_4$, SbTe and doped derivatives thereof with substitution/addition of other elements, such as nitrogen (N) and Si. Programmable vias are also described in U.S. application Ser. No. 11/393,270, entitled "Programmable Via Structure for Three Dimensional Integration Technology," filed on Mar. 30, 2006, now U.S. Pat. No. 7,545,667, the contents of which are incorporated herein by reference.

Capping layer 113 is present over programmable via 112. Capping layer 113 extends laterally a distance beyond programmable via 112 to provide adequate coverage over programmable via 112, but not so far as to make contact with either of terminals 115 or 117. According to an exemplary embodiment, capping layer 113 comprises a titanium nitride-titanium alloy (TiN/Ti). TiN/Ti provides both a good diffusion barrier between device terminal 120 and the phase change material in programmable via 112 and good adhesion between device terminal 120 and the phase change material in programmable via 112.

Each of conductive vias 114 and 116 extends through a portion of dielectric layer 108 and makes contact with heater 110. Like conductive layer 106, conductive vias 114 and 116 can each comprise any suitable standard CMOS process metal(s), including, but not limited to, one or more of W and Cu. Conductive via 118 extends through dielectric layer 108 and makes contact with conductive layer 106. As highlighted above, conductive layer 106 connects programmable via 112 with conductive via 118. Conductive via 118 can also comprise any suitable standard CMOS process metal(s), including, but not limited to, one or more of W and Cu.

Conductive vias 114, 116 and 118 can have device terminals 115, 117 and 119, respectively, associated therewith. Namely, device terminal 115 can comprise an upper portion of conductive via 114, device terminal 117 can comprise an upper portion of conductive via 116 and device terminal 119 can comprise an upper portion of conductive via 118. Since these device terminals, as described below, are formed continuous with the respective conductive vias, these device terminals will comprise the same material(s) as the conductive vias, i.e., any suitable standard CMOS process metal(s), including, but not limited to, one or more of W and Cu.

Further, device terminal 120 is present between device terminals 115 and 117 and in contact with capping layer 113. As shown in FIG. 1, device terminal 120 can be present over a portion of a side of dielectric layer 108 opposite dielectric layer 104 and surround capping layer 113. As will be described in detail below, according to an exemplary embodiment, device terminal 120 is formed along with device terminals 115, 117 and 119. Thus, like device terminals 115, 117 and 119, device terminal 120 can also comprise any suitable standard CMOS process metal(s), including, but not limited to, one or more of W and Cu.

As such, reconfigurable device 100 is a four-terminal device, e.g., having all four terminals present on a same side of the device adjacent to one another. As will be described below, heater 110 is activated via terminals 115 and 117, and a state of reconfigurable device 100 (conductive or resistive) is read through terminals 119 and 120.

FIGS. 2A-D are diagrams illustrating exemplary methodology 100 for fabricating a reconfigurable device, such as reconfigurable device 100, described in conjunction with the description of FIG. 1, above. Advantageously, the present techniques are adapted to minimize the number of processing steps needed to fabricate the device, thus lowering production costs and increasing production output.

In step 202, substrate 102 is provided. Dielectric layer 104 is then formed on substrate 102. According to an exemplary embodiment, substrate 102 comprises Si and dielectric layer 104 comprises an oxide layer (as described above) grown on substrate 102 using a thermal oxidation process. Alternatively, dielectric layer 104 can comprise an oxide layer deposited on substrate 102 using a conventional deposition process, such as chemical vapor deposition (CVD), plasma enhanced chemical vapor deposition (PECVD), atomic layer deposition (ALD) and chemical solution deposition and evaporation. With either technique, dielectric layer 104 is formed having a thickness of between about five nm and about 2,000 nm, e.g., of between about 100 nm and about 500 nm.

A recess 228 for the conductive layer (described above) is patterned into a portion of a side of dielectric layer 104 opposite substrate 102. According to an exemplary embodiment, recess 228 is formed using photolithography, wherein a photoresist is deposited on dielectric layer 104, masked and patterned with the footprint of the conductive layer. Reactive ion etching (RIE) is then used to form recess 228 in dielectric layer 104. A depth of the etch can be controlled by calculating an etch rate. A depth of recess 228 will determine a thickness of the conductive layer. Thus, recess 228 can be formed having a depth of between about five nm and about 500 nm.

In step 204, recess 228 is filled with a standard CMOS process metal(s), such as one or more of W and Cu (as described above). The metal is then planarized using, for example, chemical mechanical planarization (CMP) with dielectric layer 104 acting as an etch stop.

As such, conductive layer 106 is formed. As described in step 202, above, the depth of recess 228 determines the thickness of conductive layer 106. Therefore, according to an exemplary embodiment, conductive layer 106 has a thickness of between about five nm and about 500 nm.

In step 206, dielectric layer 108a is deposited over the side of dielectric layer 104 opposite substrate 102, so as to cover conductive layer 106. According to an exemplary embodiment, dielectric layer 108a is deposited over dielectric layer 104 using CVD.

Heater material layer 230 is then deposited on a side of dielectric layer 108a opposite dielectric layer 104. According to an exemplary embodiment, heater material layer 230 comprises a refractory metal (as described above) and is deposited on oxide layer 108a using a CVD technique, such as low pressure chemical vapor deposition (LPCVD).

In step 208, heater material layer 230 is patterned to form heater 110. According to an exemplary embodiment, photolithography is used to pattern heater material layer 230, wherein a photoresist is deposited on heater material layer 230, masked and patterned with the footprint of heater 110. A conventional dry etch, such as RIE is then used to form heater 110.

Heater 110 is positioned such that at least a portion of heater 110 overlaps conductive layer 106. Namely, since the programmable via extends through heater 110 and makes contact with the conductive layer (as described above), the portion of heater 110 through which the programmable via passes should overlap the conductive layer.

In step 210, dielectric layer 108b is deposited over the side of dielectric layer 108a opposite dielectric layer 104 so as to surround heater 110. According to an exemplary embodiment, dielectric layer 108b is deposited over dielectric layer 108a using CVD. Dielectric layers 108a and 108b together form dielectric layer 108. As described above, dielectric layers 108a and 108b can comprise the same or different compositions as each other. For example, when dielectric layer 108a has the same composition as dielectric layer 108b dielectric layer 108 is a uniform layer comprising, for example, $SiO_2$. Alternatively, when dielectric layer 108a has a different composition from dielectric layer 108b, dielectric layer 108 is a non-uniform layer, for example, comprising $SiO_2$ and $Si_2N_2O$.

In step 212, via 232 is formed through dielectric layers 108a/108b and heater 110. According to an exemplary embodiment, when each of dielectric layers 108a and 108b comprises an oxide, such as $SiO_2$, via 232 is formed using photolithography in conjunction with a three-step etching process. Namely, a photoresist is first deposited on dielectric layer 108b, masked and patterned with the via. An oxide-selective RIE is used to form via 232 through dielectric layer 108b, with heater 110 acting as an etch stop. A nitride-selective RIE is then used to form via 232 through heater 110, with dielectric layer 108a acting as an etch stop. Finally, an oxide-selective RIE is used to form via 232 through dielectric layer 108a, with conductive layer 106 acting as an etch stop. Alternatively, when each of dielectric layers 108a and 108b comprises a nitride, such as $Si_2N_2O$, via 232 can be formed using photolithography, wherein a photoresist is first deposited on dielectric layer 108b, masked and patterned with the via. A nitride-selective RIE can then be used to form via 232 through dielectric layers 108a and 108b and through heater 110, with conductive layer 106 acting as an etch stop. Combinations of the above etching processes may be employed, for example, when dielectric layer 108a comprises an oxide and dielectric layer 108b comprises a nitride, or vice versa.

In step 214, via 232 (formed in step 212, above) is filled with a phase change material (as described above). CMP is then used to planarize the phase change material in via 232, with dielectric layer 108b acting as an etch stop. As such, programmable via 112 is formed. The process used to form programmable via 112, as described above, results in a portion of programmable via 112 being surrounded by heater 110 and in contact with conductive layer 106.

In step 216, capping layer 234 is deposited over a side of dielectric layer 108b opposite dielectric layer 108a. According to an exemplary embodiment, capping layer 234 is deposited over dielectric layer 108b using CVD.

In step 218, capping layer 234 is patterned to form capping layer 113, which covers and extends laterally a distance beyond, programmable via 112 so as to provide adequate coverage over programmable via 112. According to an exemplary embodiment, capping layer 113 is formed using photolithography, wherein a photoresist is deposited on capping layer 234, masked and patterned with the footprint and location of capping layer 113. RIE is then used to form capping layer 113, with dielectric layer 108b acting as an etch stop.

In step 220, vias 236 and 238 are formed through dielectric layer 108b. According to an exemplary embodiment, photolithography is used to form vias 236 and 238, wherein a photoresist is deposited on dielectric layer 108b, masked and patterned with the vias. Deep RIE is then used to form vias 236 and 238 through dielectric layer 108b, with heater 110 acting as an etch stop. Via 240 is formed through dielectric layers 108a and 108b also using photolithography, wherein a photoresist is deposited on dielectric layer 108b, masked and patterned with the via. Deep RIE is then used to form via 240 through dielectric layers 108a and 108b, with conductive layer 106 acting as an etch stop.

In step 222, vias 236, 238 and 240, formed in step 220, above, are each filled with a metal such as one or more of W and Cu (as described above) to form conductive vias 114, 116 and 118, respectively. Device terminals 115, 117, 119 and 120 can also be formed in this step. According to an exemplary embodiment, CVD is used to deposit the metal (for conductive vias 114, 116 and 118), filling vias 236, 238 and 240 and forming a metal layer over the side of dielectric layer 108b opposite dielectric layer 108a. Photolithography is then used to pattern the device terminals, wherein a photoresist is deposited on the metal layer, masked and patterned with each of the device terminals. RIE is then used to form device terminals 115, 117, 119 and 120.

Thus, as described above, device terminal 115 will comprise an upper portion of, and be continuous with, conductive via 114, device terminal 117 will comprise an upper portion of, and be continuous with, conductive via 116 and device terminal 119 will comprise an upper portion of, and be continuous with, conductive via 118. Device terminal 120 will be in contact with and surround capping layer 113.

Figure 3A:
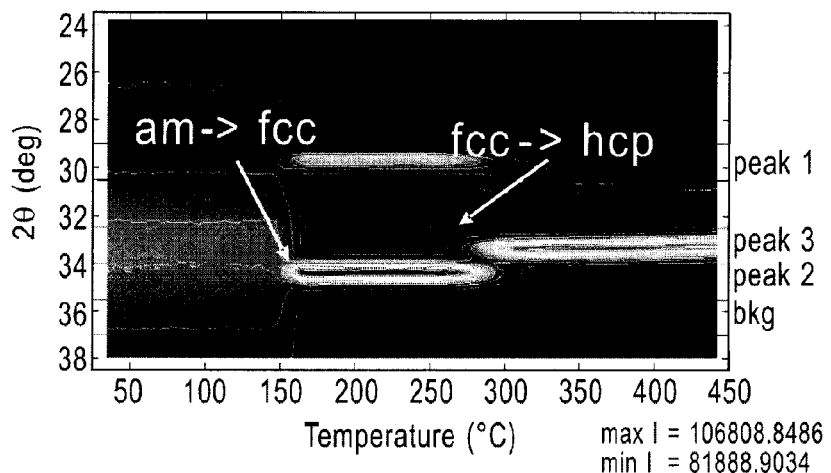
FIGS. 3A-C are graphs illustrating phase change material operation according to an embodiment of the present invention.
Figure 3B:
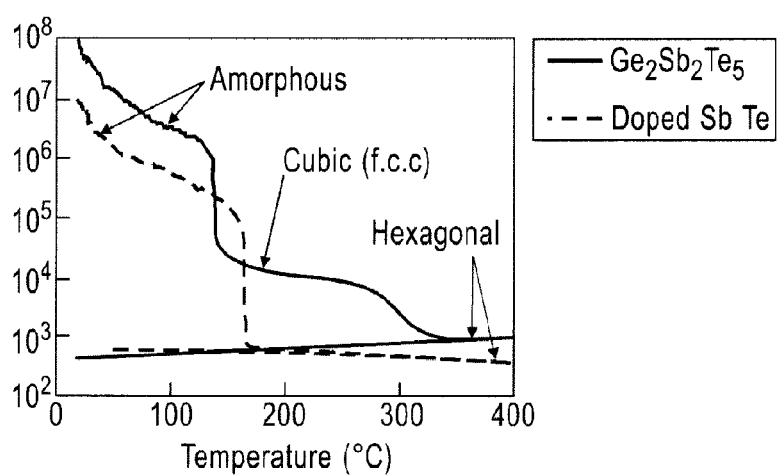
Figure 3C:
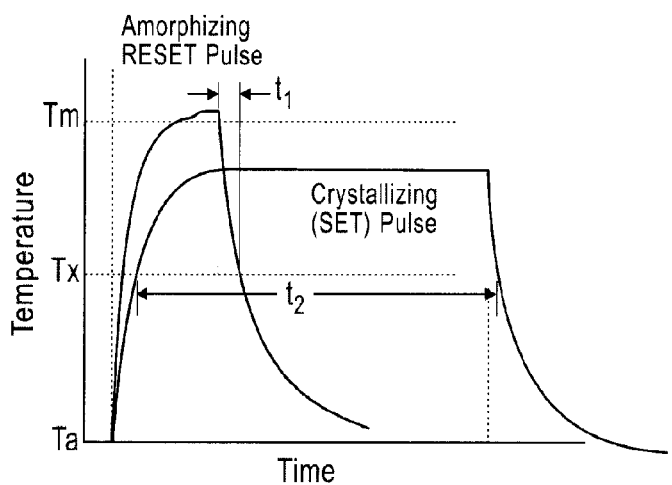

FIGS. 3A-C are graphs illustrating operation of a phase change material(s), such as the phase change material(s) used in programmable via 112 of reconfigurable device 100, described, for example, in conjunction with the description of FIG. 1, above. FIG. 3A is a graph illustrating two theta (deg) (x-ray diffraction) evolution of the crystal structure of $Ge_2Sb_2Te_5$ from amorphous (no line), to face-centered cubic (fcc) to hexagonal close-packed (hcp) on heating (with temperature measured in degrees Celsius (° C.)). In FIG. 3A, at room temperature (e.g., about 27° C.), and up to moderately elevated temperatures (e.g., up to between about 400° C. and about 500° C.), the material is stable in two phases, a crystalline phase which is a moderately good conductor of electricity (i.e., about 200 microohms centimeter ($\mu\Omega cm$), and an amorphous phase which is insulating. FIG. 3B is a graph illustrating resistivity (measured in $\mu\Omega cm$) versus temperature (measured in ° C.) for two phase change material samples, i.e., $Ge_2Sb_2Te_5$ and doped SbTe, showing different resistivities of different phases. The phases are interconverted by thermal cycling.

FIG. 3C is a graph illustrating thermal cycling for exemplary SET and RESET processes of the phase change material, as a function of temperature and time. The term "SET" and the term "RESET," as used herein, are intended to generally refer to switching the device to one of two opposite states. For example, the term "SET" may be used to describe the device being switched from an amorphous (OFF) to a crystallized (ON) state and the term "RESET" may be used to describe the device being switched from the crystallized (ON) to the amorphous (OFF) state, or vice versa. According to the exemplary embodiment shown in FIG. 3C, the thermal cycling comprises a "RESET" (or OFF) pulse and a "SET" (or ON) pulse. The "RESET" (or OFF) pulse involves a conversion from crystalline to amorphous form. In this step, the temperature is raised above melting, followed by a rapid quench in a time $t_1$ as a result of which a disordered arrangement of atoms in the melt is retained. The "SET" (or ON) pulse involves an anneal at a lower temperature, for a longer time $t_2$, which enables the amorphous form to crystallize.

Figure 4:
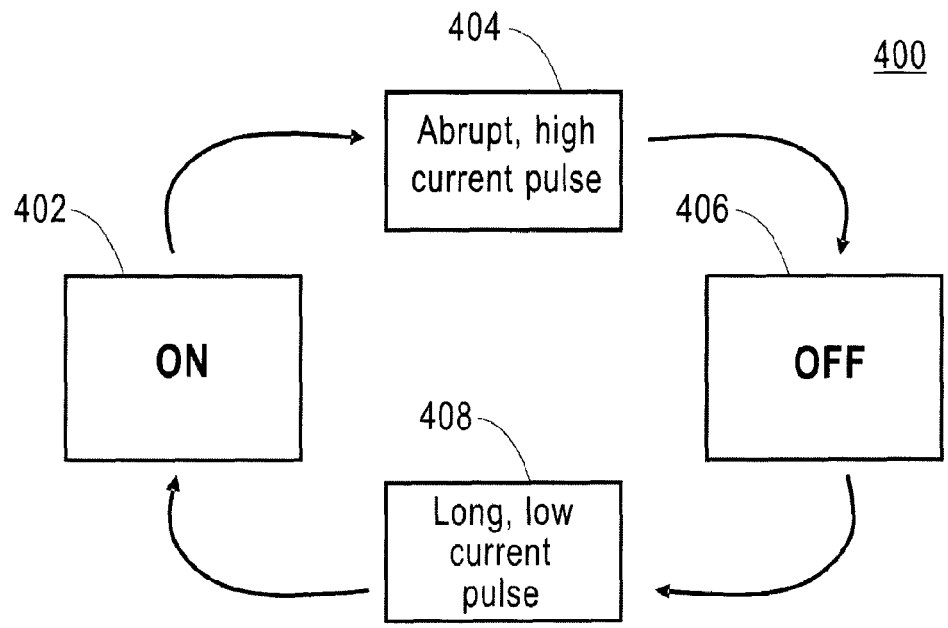
FIG. 4 is a diagram illustrating an exemplary methodology for performing a logic function with the reconfigurable device of FIG. 1 according to an embodiment of the present invention.

FIG. 4 is a diagram illustrating exemplary methodology 400 for performing a logic function with reconfigurable device 100, described, for example, in conjunction with the description of FIG. 1, above. The phase change material used in programmable via 112 can be switched between resistive (OFF-amorphous) and conductive (ON-crystalline) states by passing a current pulse through heater 110 which surrounds and is in contact with a portion of programmable via 112.

Specifically, in step 402 reconfigurable device 100 is in an ON state. In step 404, an abrupt, e.g., a 10 nanosecond (ns) ramp up, a 50 ns plateau and a two ns ramp down, high-current, e.g., greater than one milliamp (mA), pulse is passed through heater 110 to melt and quench/amorphize a thin region of the phase change material surrounded by the heater. OFF switching pulses are described in detail in conjunction with the description of FIG. 5, below. Another exemplary OFF switching pulse can comprise a 19 ns ramp up, a 20 ns plateau and a two ns ramp down, at a current of greater than one mA.

As described above, the term "SET" and the term "RESET," as used herein, are intended to refer generally to switching the device to one of two opposite states. Therefore, step 404 can be either a SET or a RESET switching process. By way of example only, if step 404 is considered a SET switching process, then step 408 (described below) is a RESET switching process. Similarly, if step 404 is considered a RESET switching process, then step 408 is a SET switching process In step 406, reconfigurable device 100 is now in a resistive (OFF-amorphous) state, and can remain in the OFF state until switched again. In step 408, an ON switching operation is accomplished by applying a relatively low current, e.g., less than or equal to about 0.5 mA, longer pulse, e.g., a 200 ns ramp up, a 1,000 ns plateau and a 200 ns ramp down, through heater 110 to anneal the amorphous phase change material to a crystalline state. ON switching pulses are described in detail in conjunction with the description of FIG. 6, below. Reconfigurable device 100 is now back in the conductive (ON-crystalline) state.

The state of reconfigurable device 100, resistive or conductive, can be read through device terminals 119 and 120. Advantageously, as highlighted above, since programmable via 112 is continuous through heater 110, the resistance of RESET (OFF or crystallized) and SET (ON or amorphous) states is governed by the programmable via alone, and does not have to take into account the resistance of other materials, such as heater materials.

Figure 5:
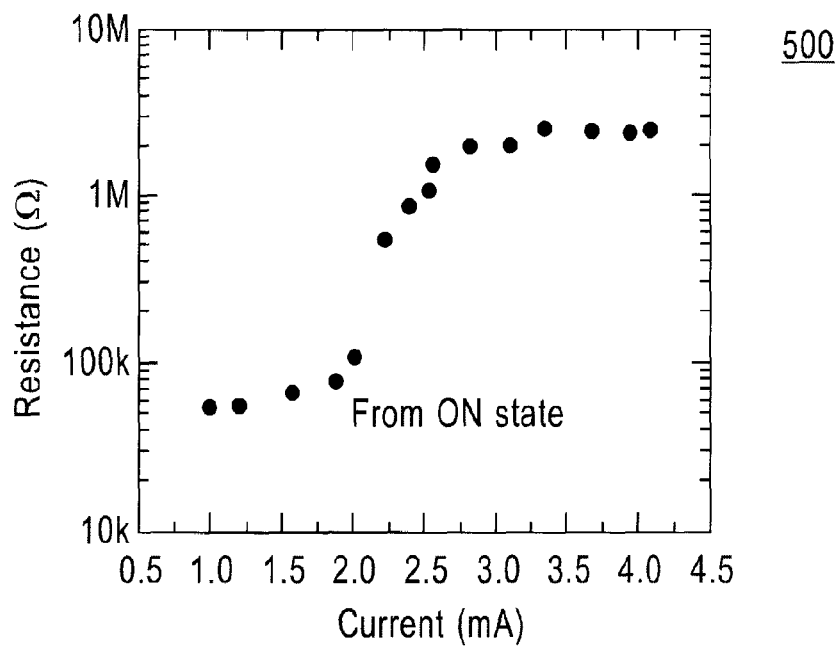
FIG. 5 is a graph illustrating resistance-current (R-I) characteristics for switching the reconfigurable device of FIG. 1 to an OFF state according to an embodiment of the present invention.

FIG. 5 is a graph 500 illustrating resistance-current (R-I) characteristics for switching reconfigurable device 100, described, for example, in conjunction with the description of FIG. 1, above, to an OFF state. According to an exemplary embodiment, 50 ns pulses with gradually increased power were applied to heater 110 from the ON state. Specifically, a ten ns ramp up, a 50 ns plateau and a two ns ramp down were employed. After each pulse, reconfigurable device 100 was switched back to the ON state. When the pulse current reached about two milliamps (mA), the programmable via resistance started to increase and finally reached the OFF state.

Figure 6:
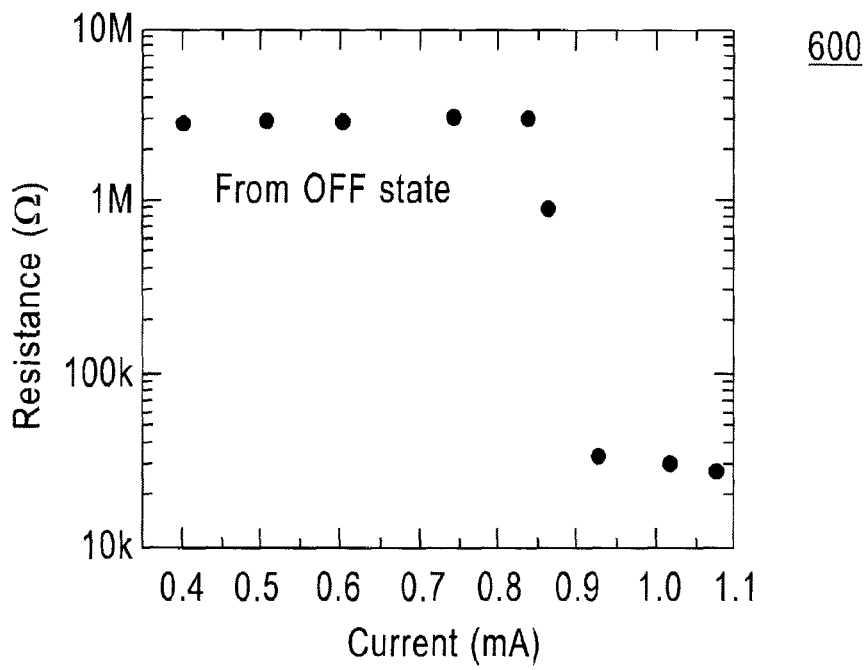
FIG. 6 is a graph illustrating R-I characteristics for switching the reconfigurable device of FIG. 1 to an ON state according to an embodiment of the present invention.

FIG. 6 is a graph 600 illustrating R-I characteristics for switching reconfigurable device 100, described, for example, in conjunction with the description of FIG. 1, above, to an ON state. Starting from an OFF state, one microsecond (µs) pulses with gradually increased power were applied to heater 110, finally implementing switching of the device to the ON state. Specifically, a 200 ns ramp up, a 1,000 ns plateau and then a 200 ns ramp down were employed.

Figure 7:
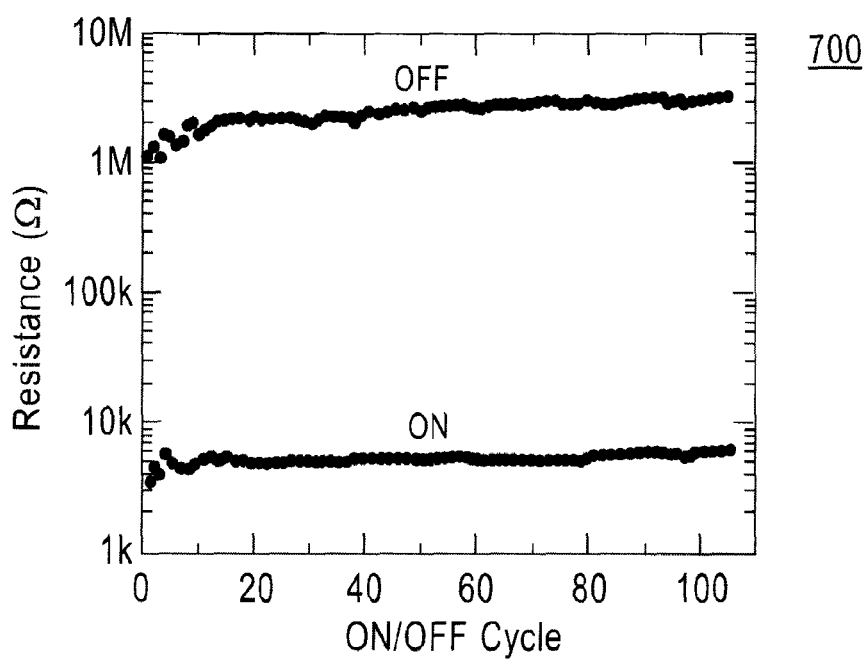
FIG. 7 is a graph illustrating cycling data from an endurance test of the reconfigurable device of FIG. 1 performed at room temperature according to an embodiment of the present invention.

FIG. 7 is a graph 700 illustrating cycling data from an endurance test performed on reconfigurable device 100, described, for example, in conjunction with the description of FIG. 1, above, at room temperature. The endurance test results show a stable sense margin without obvious degradation within the ON/OFF cycles.

Figure 8:
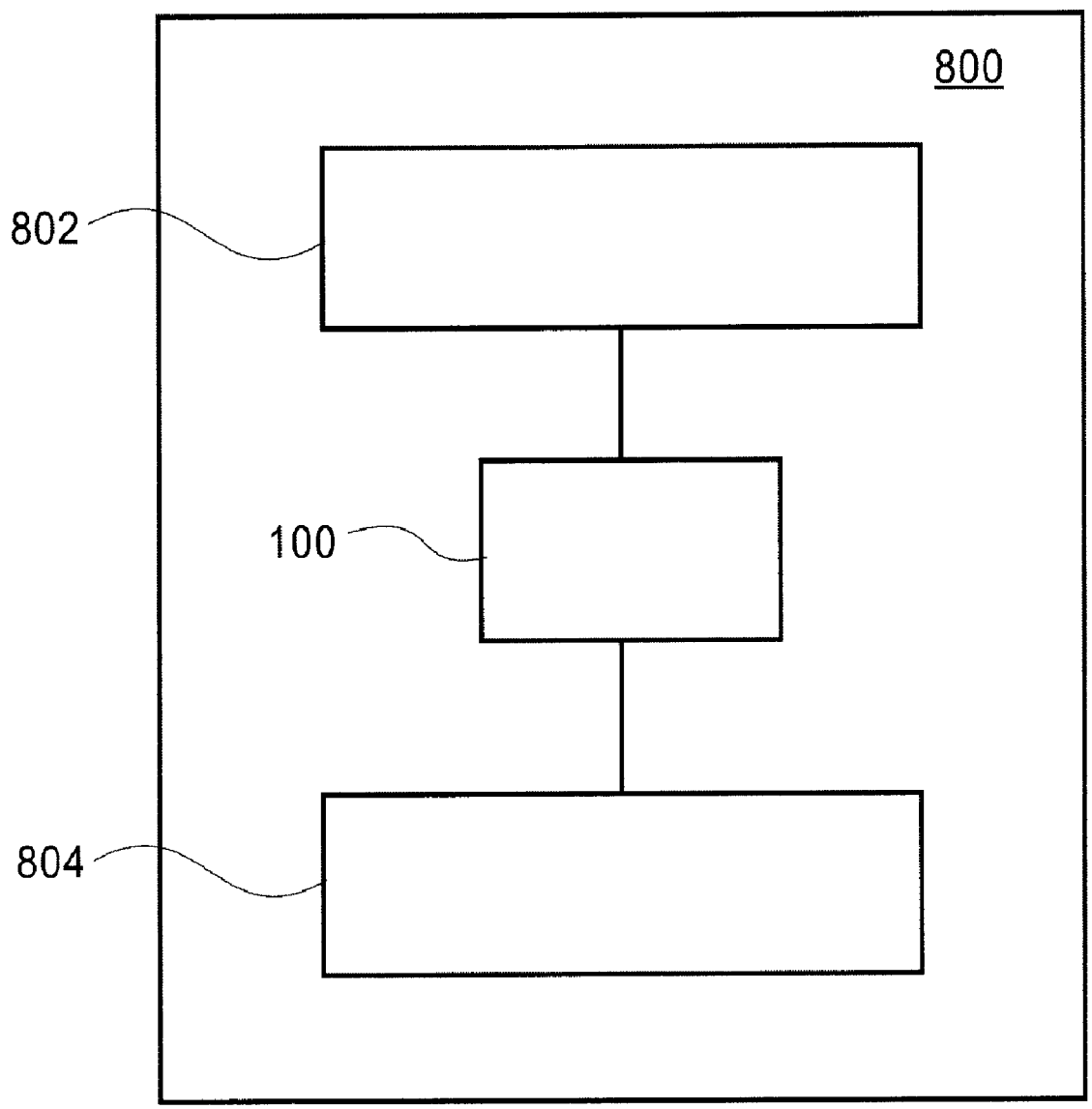
FIG. 8 is a diagram illustrating an exemplary integrated logic circuit according to an embodiment of the present invention.

FIG. 8 is a diagram illustrating exemplary integrated logic circuit 800. Integrated logic circuit 800 comprises logic block 802 associated with logic block 804 via a reconfigurable device, such as reconfigurable device 100 described in conjunction with the description of FIG. 1, above, therebetween. According to an exemplary embodiment, integrated logic circuit 800 comprises a field programmable gate array (FPGA).

As described above, reconfigurable device 100 can be switched between a conductive and a resistive state. Thus, when reconfigurable device 100 is in a conductive state, logic block 802 is connected to logic block 804. Conversely, when reconfigurable device 100 is in a resistive state, the connection between logic blocks 802 and 804 is severed. Integrated logic circuit 800 can comprise a plurality of reconfigurable devices 100 to provide a variety of (reconfigurable) circuit configurations.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of performing a logic function, the method comprising the steps of:
   providing a reconfigurable device comprising:
      a substrate;
      a first dielectric layer on the substrate;
      a conductive layer recessed into at least a portion of a side of the first dielectric layer opposite the substrate;
      at least one second dielectric layer over the side of the first dielectric layer opposite the substrate, so as to cover the conductive layer;
      a heater within the second dielectric layer;
      at least one programmable via extending through the second dielectric layer, extending through and surrounded by the heater and in contact with the conductive layer, the programmable via comprising at least one phase change material;
      a capping layer over the programmable via;
      a first conductive via and a second conductive via, each extending through the second dielectric layer and in contact with the heater; and
      a third conductive via extending through the second dielectric layer and in contact with the conductive layer; and
   passing one or more of:
      an OFF switching pulse through the heater, when the programmable via is in a conductive state, the OFF switching pulse being configured to amorphize at least a portion of the phase change material in the programmable via to switch the programmable via to a resistive state, and
      an ON switching pulse through the heater, when the programmable via is in a resistive state, the ON switching pulse being configured to anneal at least a portion of the phase change material in the programmable via to switch the programmable via to a conductive state.

2. The method of claim 1, wherein the device further comprises:
- a first device terminal and a second device terminal, wherein the first device terminal comprises an upper portion of, and is continuous with, the first conductive via, and wherein the second device terminal comprises an upper portion of, and is continuous with, the second conductive via;
- a third device terminal, wherein the third device terminal comprises an upper portion of, and is continuous with, the third conductive via; and
- a fourth device terminal, located between the first and second device terminals, in contact with the capping layer.

3. The method of claim 1, wherein the phase change material comprises one or more of ternary alloys of germanium (Ge), antimony (Sb) and tellurium (Te) (GST), $Ge_2Sb_2Te_5$, GeSb, $GeSb_4$, SbTe and derivatives thereof doped with one or more of nitrogen and silicon.

4. The method of claim 1, wherein the OFF switching pulse has a current of greater than one milliamp.

5. The method of claim 4, wherein the OFF switching pulse comprises a 19 nanosecond ramp up, a 20 nanosecond plateau and a two nanosecond ramp down.

6. The method of claim 1, wherein the ON switching pulse has a current of less than or equal to about 0.5 milliamps.

7. The method of claim 6, wherein the ON switching pulse comprises a 200 nanosecond ramp up, a 1,000 nanosecond plateau and a 200 nanosecond ramp down.

* * * * *